US008582082B2

(12) United States Patent
Staals et al.

(10) Patent No.: US 8,582,082 B2
(45) Date of Patent: Nov. 12, 2013

(54) METHOD AND LITHOGRAPHIC APPARATUS FOR MEASURING AND ACQUIRING HEIGHT DATA RELATING TO A SUBSTRATE SURFACE

(75) Inventors: Frank Staals, Eindhoven (NL); Paulus Antonius Andreas Teunissen, Eindhoven (NL); Ronald Albert John Van Doorn, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 505 days.

(21) Appl. No.: 12/399,737

(22) Filed: Mar. 6, 2009

(65) Prior Publication Data

US 2009/0231563 A1      Sep. 17, 2009

Related U.S. Application Data

(60) Provisional application No. 61/064,545, filed on Mar. 11, 2008.

(51) Int. Cl.
*G03B 27/52*     (2006.01)
*G03B 27/32*     (2006.01)

(52) U.S. Cl.
USPC ............................................. 355/55; 355/77

(58) Field of Classification Search
USPC ............................. 355/39, 44, 53, 55, 72, 77
See application file for complete search history.

(56) References Cited

U.S. PATENT DOCUMENTS

| | | | |
|---|---|---|---|
| 5,191,200 A | | 3/1993 | Van der Werf et al. |
| 5,448,332 A | * | 9/1995 | Sakakibara et al. ............ 355/53 |
| 5,633,721 A | * | 5/1997 | Mizutani ...................... 356/401 |
| 7,113,256 B2 | | 9/2006 | Butler et al. |
| 7,154,583 B2 | * | 12/2006 | Kondo ............................. 355/53 |
| 7,206,058 B2 | | 4/2007 | Modderman et al. |
| 7,256,866 B2 | | 8/2007 | Cox et al. |
| 7,265,364 B2 | | 9/2007 | Teunissen et al. |
| 7,502,096 B2 | | 3/2009 | Tempelaars et al. |
| 2006/0139595 A1 | | 6/2006 | Koenen et al. |
| 2008/0123075 A1 | * | 5/2008 | Kosugi ............................. 355/72 |

FOREIGN PATENT DOCUMENTS

| | | |
|---|---|---|
| CN | 1658073 A | 8/2005 |
| EP | 0 380 967 A2 | 8/1990 |
| EP | 0 502 583 A1 | 9/1992 |

(Continued)

OTHER PUBLICATIONS

Korean Office Action directed to related Korean Application No. KR 10-2009-0020436, mailed Nov. 16, 2010 from the Korean Patent Office, Seoul, Korea; 2 pages.

(Continued)

*Primary Examiner* — Peter B Kim
*Assistant Examiner* — Michelle Iacoletti
(74) *Attorney, Agent, or Firm* — Sterne, Kessler, Goldstein & Fox P.L.L.C.

(57) ABSTRACT

A lithographic apparatus includes a level sensor for use in positioning a target portion of the substrate with respect to a focal plane of the projection system, a pair of actuators, configured to move a substrate table of the lithographic apparatus, and a controller for moving the substrate relative to the level sensor by controlling the actuators. The controller combines motions of the first and second actuators to produce a combined movement having a speed higher than a maximum speed of at least one of the actuators individually.

19 Claims, 10 Drawing Sheets

(56) References Cited

FOREIGN PATENT DOCUMENTS

Figure 1:
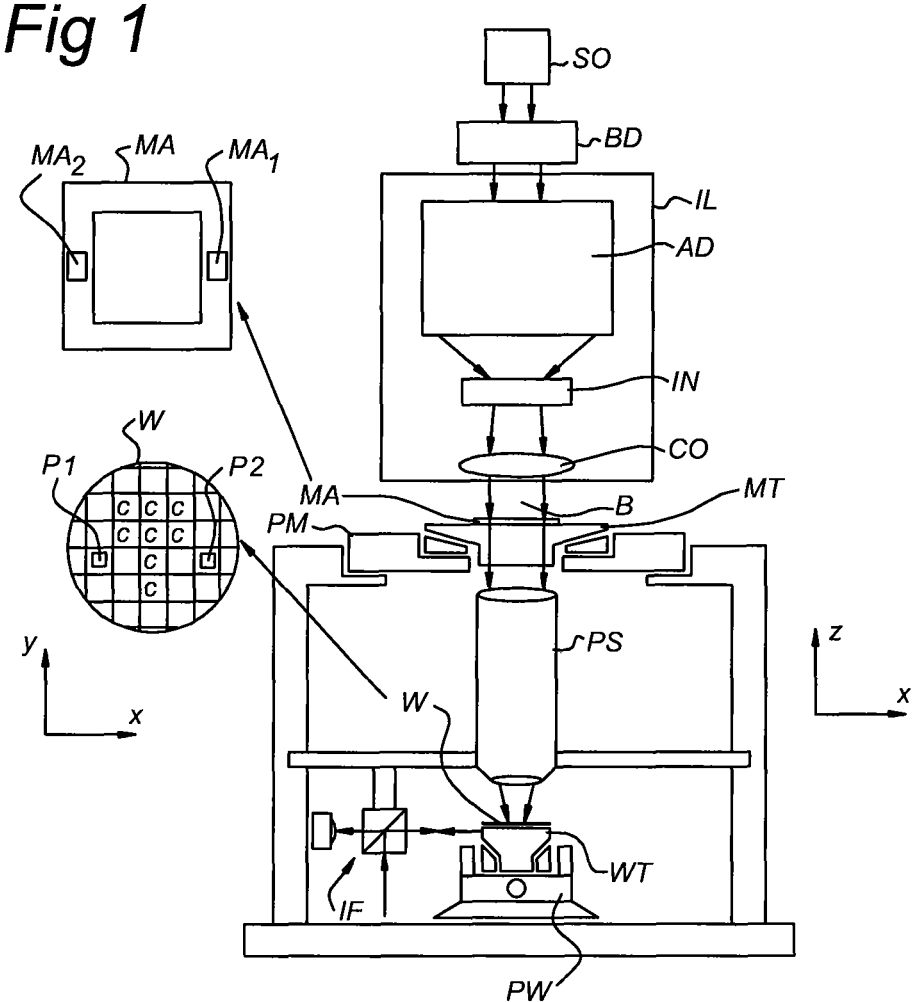

| | | |
|---|---|---|
| EP | 1 843 209 A2 | 10/2007 |
| JP | 06-005495 A | 1/1994 |
| JP | 2000-182929 A | 6/2000 |
| JP | 2000-323404 A | 11/2000 |
| JP | 2005-354073 A | 12/2005 |
| JP | 2007-273955 A | 10/2007 |
| KR | 10-0696733 | 3/2007 |
| KR | 10-0775544 | 11/2007 |
| WO | WO 98/28665 A1 | 7/1998 |
| WO | WO 98/40791 A1 | 9/1998 |

OTHER PUBLICATIONS

English-Language Translation of Notice of Reasons for Rejection directed to related Japanese Patent Application No. 2009-049994, mailed Jun. 23, 2011, from the Japanese Patent Office; 3 pages.

English-Language Translation of the Second Office Action directed to related Chinese Patent Application No. 200910126513.6, mailed Nov. 17, 2011, from the State Intellectual Property Office of the People's Republic of China; 3 pages.

\* cited by examiner

US 8,582,082 B2

METHOD AND LITHOGRAPHIC APPARATUS FOR MEASURING AND ACQUIRING HEIGHT DATA RELATING TO A SUBSTRATE SURFACE

CROSS-REFERENCE TO RELATED APPLICATIONS

The present application claims the benefit of U.S. Provisional Patent Appl. No. 61/064,545, filed Mar. 11, 2008, which is incorporated by reference herein in its entirety.

BACKGROUND

1. Field

Embodiments of the present invention relate to a lithographic apparatus and method for acquiring height data of a substrate surface, to a program and a memory containing the program for acquiring height data and to a method, apparatus, program and memory for correcting height data acquired according to said method.

2. Background

A lithographic apparatus is a machine that applies a desired pattern onto a target portion of a substrate. Lithographic apparatus can be used, for example, in the manufacture of integrated circuits (ICs). In this case, a patterning device, which is alternatively referred to as a mask or a reticle, may be used to generate a circuit pattern corresponding to an individual layer of the IC. This pattern can be transferred onto a target portion (e.g., including part of, one or several dies) on a substrate (e.g., a silicon wafer). Transfer of the pattern is typically via imaging onto a layer of radiation-sensitive material (resist) provided on the substrate. This is done using a projection system that is between the reticle and the substrate and is provided to image an irradiated portion of the reticle onto a target portion of a substrate. The pattern can be imaged onto an exposure area (die) on the substrate (silicon wafer). In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus may be of a type having two (dual stage) or more substrate tables (and/or two or more mask tables). This is described in more detail below.

In current dual stage apparatus, data is gathered to level every target portion (field) with a level sensor in exactly the same position with respect to the center of the target portion.

The projection system includes components to direct, shape and/or control a beam of radiation. The pattern can be imaged onto the target portion (e.g., including part of one, or several, dies) on a substrate, for example a silicon wafer, that has a layer of radiation-sensitive material, such as resist. In general, a single substrate contains a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction, usually referred to as the "scanning" direction, while synchronously scanning the substrate parallel or anti-parallel to this direction.

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam, and such elements may also be referred to below, collectively or singularly, as a "lens". In addition, the first and second object tables may be referred to as the "mask table" and the "substrate table", respectively.

A lithographic apparatus can contain a single mask table and a single substrate table, but are also available having at least two independently moveable substrate tables; see, for example, the multi-stage apparatus described in International Patent Applications WO98/28665 and WO98/40791, which are incorporated herein in their entireties. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement positions.

During exposure processes, it is important to ensure that the mask image is correctly focused on the wafer. Conventionally this has been done by measuring the vertical position of the best focal plane of the aerial image of the mask relative to the projection lens before an exposure or a series of exposures. During each exposure, the vertical position of the upper surface of the wafer relative to the projection lens is measured and the position of the wafer table is adjusted so that the wafer surface lies in the best focal plane.

Referring to FIG. 1, the scope for adjusting the position of the focal plane of the projection system PL is limited and the depth of focus of that system is small. This means that the exposure area of the wafer (substrate) must be positioned precisely in the focal plane of the projection system PL.

Wafers are polished to a very high degree of flatness but nevertheless deviation of the wafer surface from perfect flatness (referred to as "unflatness") of sufficient magnitude noticeably to affect focus accuracy can occur. Unflatness may be caused, for example, by variations in wafer thickness, distortion of the shape of the wafer or contaminants on the wafer holder. The presence of structures due to previous process steps also significantly affects the wafer height (flatness). In the present invention, the cause of unflatness is largely irrelevant; only the height of the top surface of the wafer is considered. Unless the context otherwise requires, references below to "the wafer surface" refer to the top surface of the wafer onto which will be projected the mask image.

During exposures, the position and orientation of the wafer surface relative to the projection optics are measured and the vertical position (Z) and horizontal tilts (Rx, Ry) of the wafer table WT are adjusted to keep the wafer surface at the optimal focus position.

As described above, imaging a pattern onto a substrate W is usually done with optical elements, such as lenses or mirrors. In order to generate a sharp image, a layer of resist on the substrate W should be in or near the focal plane of the optical elements. Therefore, according to the prior art, the height of the target portion C that is to be exposed is measured. Based on these measurements, the height of the substrate W with respect to the optical elements is adjusted, e.g., by moving the substrate table WT on which the substrate W is positioned. Since a substrate W is not a perfectly flat object, it may not be possible to position the layer of resist exactly in the focal plane of the optics for the whole target portion C, so the substrate W may only be positioned as well as possible.

In order to position the substrate W in the focal plane as well as possible (e.g., by matching the focal plane to the centre of the resist thickness), the orientation of the substrate W can be altered. The substrate table WT may be translated, rotated or tilted, in all six degrees of freedom, in order to position the layer of resist in the focal plane as well as possible.

In order to determine the best positioning of the substrate W with respect to the optical elements, the surface of the substrate W may be measured using a level sensor, as for instance described in U.S. Pat. No. 5,191,200, incorporated herein by reference in its entirety. This procedure may be done during exposure (on-the-fly), by measuring the part of the substrate W that is being exposed or is next to be exposed, but the surface of the substrate W may also be measured in advance. This latter approach may also be done at a remote position. In the latter case, the results of the level sensor measurements may be stored in the form of a so-called height map or height profile and used during exposure to position the substrate W with respect to the focal plane of the optical elements.

In both cases, the top surface of the substrate W may be measured with a level sensor that determines the height of a certain area. This area may have a width about equal to or greater than the width of the target portion C and may have a length that is only part of the length of target portion C, which will be explained below (the area being indicated with the dashed line). The height map of a target portion C may be measured by scanning the target portion C in the direction of the arrow A. The level sensor LS determines the height of the substrate W by applying a multi-spot measurement, such as for instance a 9-spot measurement. Level sensor spots LSS are spread over the area and, based on the measurements obtained from the different level sensor spots, height data may be collected.

The term "height" as used here refers to a direction substantially perpendicular to the surface of the substrate W, i.e., substantially perpendicular to the surface of the substrate W that is to be exposed. The measurements of a level sensor result in height data, including information about the relative heights of specific positions of the substrate W. This may also be referred to as a height map.

Based on this height data, a height profile may be computed, for instance by averaging corresponding height data from different parts of the substrate (e.g., height data corresponding to similar relative positions within different target portions C). In case such corresponding height data is not available, the height profile is equated to the height data.

Based on height data or a height profile, a leveling profile may be determined to provide an indication of an optimal positioning of the substrate W with respect to a projection system PS. Such a leveling profile may be determined by applying a linear fit through (part of) the height data or the height profile, e.g., by performing a least squares fit (three dimensional) through the points that are inside the measured area.

As explained above, accurate leveling may require measuring the shape and topography of the substrate, for instance using a level sensor, resulting in height data of (at least part) of the substrate W, based on which a leveling profile can be determined. Such a leveling profile may represent the optimal position of the substrate W with respect to the projection system PS, taking into account the local shape and height of the substrate W.

By leveling every target portion in exactly the same position with respect to the centre of the target portion, variation of exposure focus between target portions on a substrate is reduced.

Figure 2:
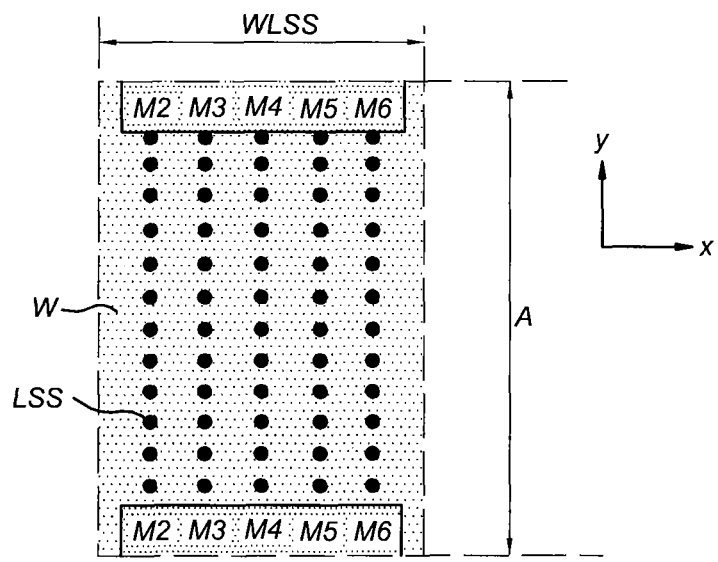

For example, every target portion may have a leveling sampling pattern with respect to the center of the target portion as shown in FIG. 2. In FIG. 2, M2-M6 refer to the level sensor spots, covering the target portion widths, which are scanned over the surface over the target portion along the target portion height. During the scanning, a number of measurements are gathered, indicated by the dots in FIG. 2. These dots have a predetermined position with respect to the target portion center.

It is relatively time consuming to take leveling data according to the technique as shown and described with reference to FIG. 2. This is because it is time consuming to take leveling data for each target portion that meets the constraint of positioning the level sensor in the same position with respect to the center of each target portion. In the most common case of a columnar target portion layout, this requires a 'stroke' of level sensor readings through each column.

Figure 4:
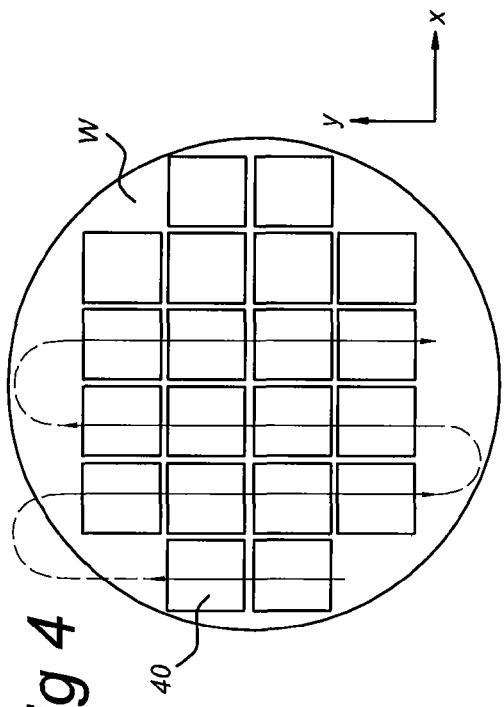

This is further illustrated with reference to FIG. 4, showing a substrate with a plurality of target portions and arrows indicating the scanning path or strokes of the level sensor.

SUMMARY

It is an aspect of embodiments of the present invention to alleviate, at least partially, the problems discussed above.

According to a first aspect of the present invention, there is provided a lithographic projection apparatus including a support constructed to support a patterning device, the patterning device being capable of imparting a radiation beam with a pattern in its cross-section to form a patterned radiation beam, a substrate table constructed and arranged to hold a substrate, a projection system constructed and arranged to project the patterned radiation beam onto a target portion of the substrate, a level sensor constructed and arranged to perform height measurements of at least part of the substrate to generate height data for use in positioning a target portion of the substrate with respect to a focal plane of the projection system, a first actuator constructed and arranged to move the substrate table at least in a first direction perpendicular to a surface of the substrate having a maximum speed, a second actuator constructed and arranged to move the substrate table at least in a second direction perpendicular to a surface of the substrate having a maximum speed, and a controller constructed and arranged to generate a stroke of relative movement between the substrate and the level sensor, by controlling the first and second actuator, wherein the controller is constructed and arranged to combine first and second actuator movement to effect combined movement at a speed higher than the maximum speed of one actuator.

In an embodiment, the controller is constructed and arranged to generate the stroke of combined movement by combining at least 71% of the maximum speed of both actuators.

Further the controller may be constructed and arranged to generate a stroke of combined movement of both actuators moving the substrate table at generally maximum speed.

The first actuator may be constructed and arranged to cause relative movement in the X-direction while the second actuator is constructed and arranged to cause relative movement in the Y-direction.

The substrate table may be moveable to effect a scanning exposure of a substrate carried by said substrate holder, and said level sensor may be arranged to measure at least one of the vertical position and the tilt about at least one horizontal axis of a target area on said substrate.

In an embodiment, the level sensor includes a projection part for directing radiation onto the substrate including a radiation source, a projection grid having slits positioned downstream from the radiation source, and a first reflector positioned to direct radiation from the radiation source towards a substrate surface as level sensor spots, and a detection part for detecting reflected radiation from the substrate surface, including a detector, a detection grid having slits positioned in between the substrate and the detector, and a second reflector positioned to direct light reflected from the wafer surface to a detector, wherein the grids are positioned to project and detect level sensor spots that are aligned with the stroke of the relative movement.

In a further embodiment the level sensor spots on the substrate are rotated over generally 45 degrees with respect to the direction of movement of at least one of the actuators.

It may be useful to position at least one of the projection grid or detection grid generally in parallel with the substrate surface.

In an embodiment at least one of the projection grid or the detection grid is generally of rectangular shape and has slits positioned generally along the diagonal of the grid.

In an embodiment the substrate table is tilted over an angle corresponding to the angle of the stroke of movement.

At least one of the projection grid or the detection grid is, in an embodiment, tilted such that the slits are at different distances from the radiation source.

In an embodiment, at least one of the projection grid or the detection grid is tilted around an axis generally perpendicular to a plane formed by a traveling direction of the radiation and an axis of the slits.

The projection grid may be tilted such that a tilt angle of the projection grid and an incident angle of the radiation combine to generally 90 degrees (Scheimpflug condition).

In an embodiment, the projection part further includes a wedge positioned in the path of radiation downstream from the projection grid for adapting the optical path length of the radiation.

In an embodiment, the detection part further includes a wedge positioned in the path of radiation upstream from the detection grid for adapting the optical path length of the radiation.

According to another aspect of the invention, there is provided a method for sensing the level of a substrate carried on a substrate table, in a lithographic projection apparatus, that has a support constructed to support a patterning device, the patterning device being capable of imparting a radiation beam with a pattern in its cross-section to form a patterned radiation beam; a substrate table constructed and arranged to hold a substrate; a projection system constructed and arranged to project the patterned radiation beam onto a target portion of the substrate; a level sensor constructed and arranged to perform height measurements of at least part of the substrate to generate height data, first and second actuators for generating a relative moment between substrate and the level sensor, the actuators having a maximum speed, the method including: providing a substrate on the substrate table; generating relative movement between the substrate and the level sensor, sensing a level of the substrate; and combining the relative movement generated by the two actuators to a velocity higher than the maximum velocity of movement generated by one actuator.

The method may include any of the features of the apparatus. Further, the generated relative movement may be a movement in several strokes. The height measurements may be performed by scanning at least part of the substrate in a scanning direction with a level sensor.

In an embodiment, the first actuator generates a movement in an X-direction and the second actuator generates movement in a Y-direction, wherein the combined movement is in the X-Y plane under an angle of at least 20 degrees with respect to the substrate surface.

The movement includes, in an embodiment, strokes generally at a 45 degree angle with respect to the X and Y directions.

The method may further include the level sensor projecting radiation on the substrate surface and detecting the reflected radiation from the substrate surface.

In a further embodiment, projecting the radiation further includes applying a number of beams of radiation on the substrate surface as level sensors spots, wherein the level sensor spots are rotated over a non-zero angle with respect to at least one of the directions of relative movement and wherein combining the relative movement results in a relative movement at generally the same non-zero angle.

In a further embodiment, the optical path length of at least one of the projected radiation or reflected radiation is adapted using refraction.

According to another aspect of the present invention, there is provided a computer program on a computer readable medium, or a computer program product, the computer program or computer program product having code or instructions stored thereon and arranged to perform the method of: generating relative movement between the substrate and the level sensor; and sensing the level of the substrate with the level sensor, wherein the generated relative movement is a combined movement of at least two actuators for generating movement of the substrate table relative to the level sensor.

According to another aspect of the present invention, there is provided a device that is made directly or indirectly using the lithography system and/or device manufacturing method and/or computer program of any of the preceding aspects of the invention.

According to still another aspect of the invention, there is provided a method for calibrating a lithographic apparatus including: performing a level sensor scan over the target portion providing level sensor data for the target portion, wherein the level sensor scan is performed at a relative position with respect to the target portion, and determining corrected exposure focus data using the level sensor data and predetermined calibration data to correct for the relative position of the level sensor scan with respect to the target portion. According to an embodiment, determining corrected exposure focus data includes: determining corrected level sensor data using the predetermined calibration data, and determining corrected exposure focus data based on the corrected level sensor data.

According to an embodiment, determining corrected exposure focus data includes: determining exposure focus data using the level sensor data, and determining corrected exposure focus data based on the exposure focus data and the predetermined calibration data.

According to an embodiment the method further includes: exposing the target portion in accordance with the corrected exposure focus data.

According to an embodiment the relative position is substantially in the plane of the target portion and substantially perpendicular to a scan direction of the level sensor scan.

According to an embodiment the calibration data can be used to determine corrected exposure focus data to correct for the relative position of a level sensor scan with respect to a target position, the method including: performing a first number of calibration level sensor scans of at least one target portion, wherein the first number of calibration level sensor scans have a first relative position with respect to the at least one target portion, performing a second number of calibration level sensor scans of at least one target portion, wherein the second number of calibration level sensor scans have a second relative position with respect to the at least one target portion, the second relative position being different from the first relative position, and determining first calibration data for the second relative position by comparing the second number of calibration level sensor scans to the first number of calibration level sensor scans.

In an embodiment, the second number of level sensor scans are performed by generating a combined relative movement of the substrate and the level sensor with two actuators, moving at a higher speed than the maximum speed of one actuator.

According to yet a further aspect a computer program is provided on a computer readable medium, or a computer program product, the computer program having code or instructions stored thereon for sensing the level of a substrate carried on a substrate table, the code or instructions for performing the method of: generating relative movement between the substrate and the level sensor; and sensing the level of the substrate with the level sensor, wherein the generated relative movement is a combined movement of at least two actuators for generating movement of the substrate table relative to the level sensor.

According to yet a further aspect a system is provided for controlling the position of a substrate, the system including a processor and a memory, the memory being encoded with a computer program containing instructions that are executable by the processor to perform, using height data, a method for positioning a target portion of the substrate with respect to a focal plane of a projection system, wherein the method includes: performing height measurements of at least part of the substrate to generate the height data by generating relative movement between the substrate and the level sensor; sensing the level of the substrate with the level sensor, wherein the generated relative movement is a combined movement of at least two actuators for generating movement of the substrate table relative to the level sensor; using predetermined correction heights to compute corrected height data for the height data; and positioning the target portion of the substrate with respect to the focal plane of the projection system at least partially based on the corrected height data.

In an embodiment of the invention, a system for controlling the position of a substrate includes a processor and a memory, the memory being encoded with a computer program containing instructions that are executable by the processor to perform a method for calculating correction heights to correct height data obtained by a level sensor, wherein the method includes: performing height measurements of a target portion of the substrate to generate a height profile by generating relative movement between the substrate and the level sensor and sensing the level of the substrate with the level sensor, wherein the generated relative movement is a combined movement of at least two actuators for generating movement of the substrate table relative to the level sensor; computing a level profile based on the height profile; and determining correction heights by computing the difference between the level profile and the height profile.

Another aspect of the invention provides a computer-readable medium encoded with a computer program containing instructions that are executable by a processor to perform, using height data, a method for positioning a target portion of a substrate with respect to a focal plane of a projection system, wherein the method includes: performing height measurements of at least part of the substrate to generate the height data by generating relative movement between the substrate and the level sensor and sensing the level of the substrate with the level sensor, wherein the generated relative movement is a combined movement of at least two actuators for generating movement of the substrate table relative to the level sensor; using predetermined correction heights to compute corrected height data for the height data; and positioning the target portion of the substrate with respect to the focal plane of the projection system at least partially based on the corrected height data.

Yet another aspect of the invention provides a computer-readable medium encoded with a computer program containing instructions that are executable by a processor to perform, using height data, a method for positioning a target portion of a substrate with respect to a focal plane of a projection system, wherein the method includes: performing height measurements of a target portion of the substrate to generate a height profile by generating relative movement between the substrate and the level sensor and sensing the level of the substrate with the level sensor, wherein the generated relative movement is a combined movement of at least two actuators for generating movement of the substrate table relative to the level sensor; computing a level profile based on the height profile; and determining correction heights by computing the difference between the level profile and the height profile.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts an exemplary lithographic apparatus.

FIG. 2 schematically depicts a target portion.

Figure 3:
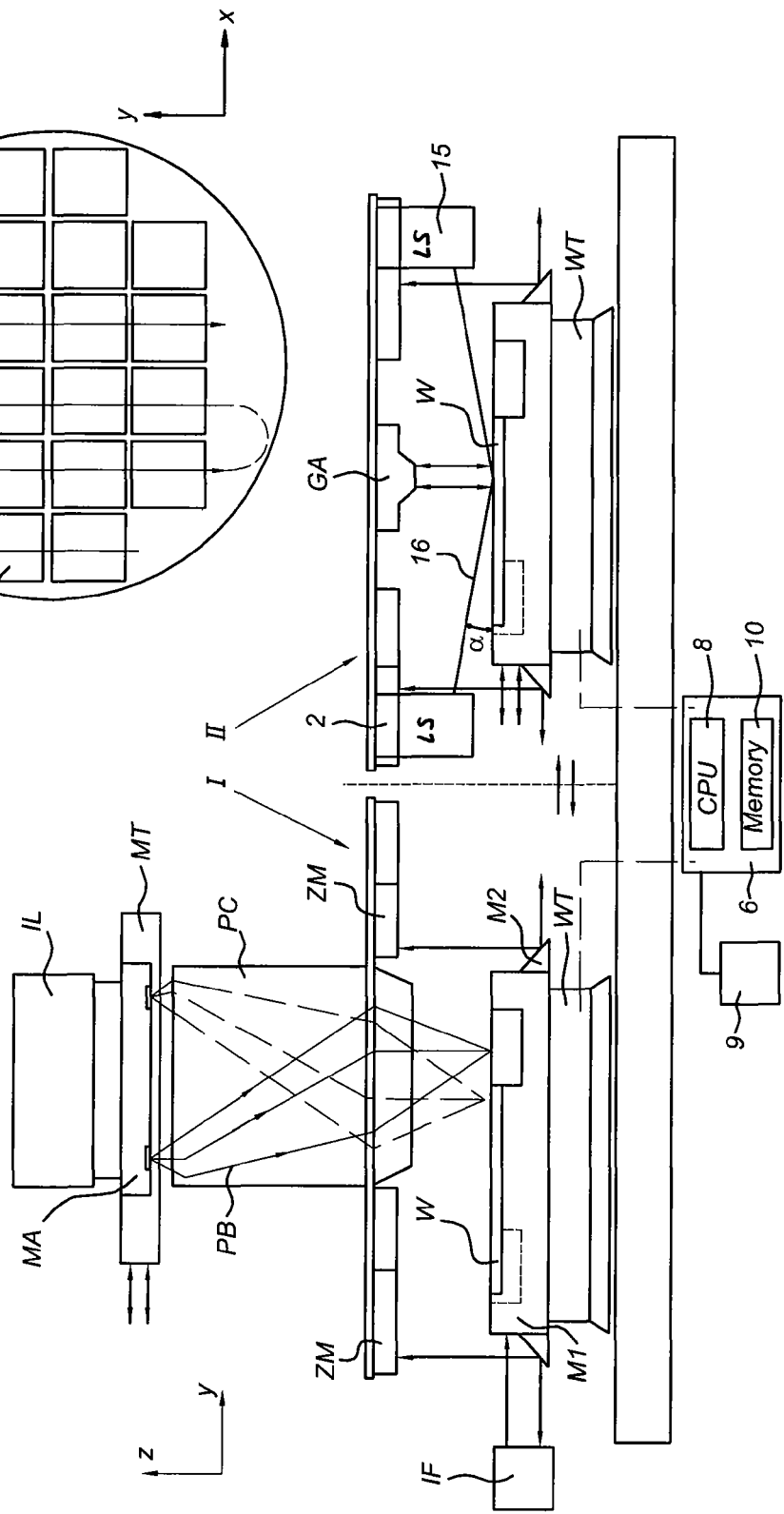

FIG. 3 is a more detailed view of parts of the apparatus of FIG. 1, according to an embodiment of the invention.

FIG. 4 schematically depicts a substrate with a plurality of target portions and arrows indicating the scanning path of the level sensor according to the prior art.

Figure 5:
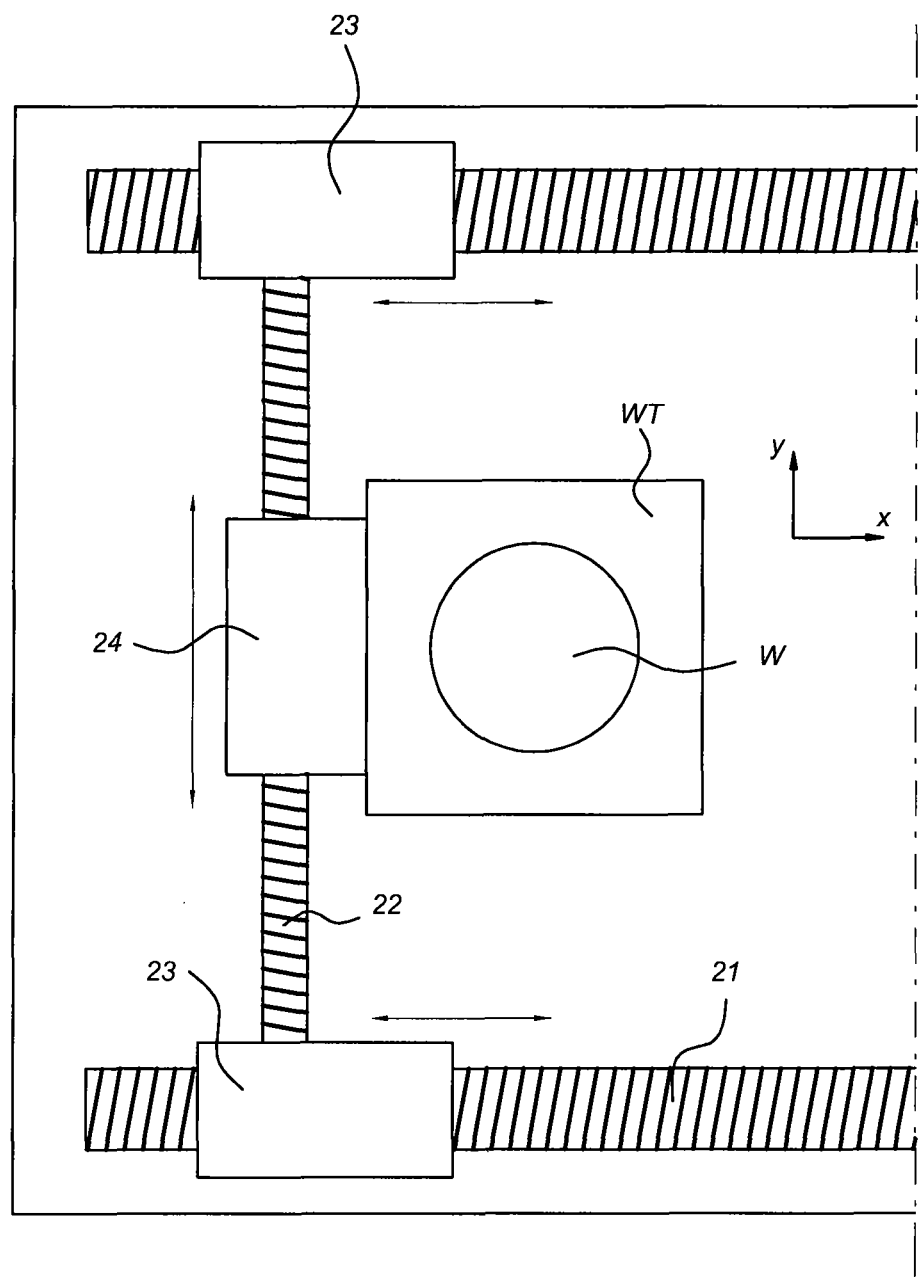

FIG. 5 is a detailed view of a wafer stage according to an embodiment of the invention.

Figure 6:
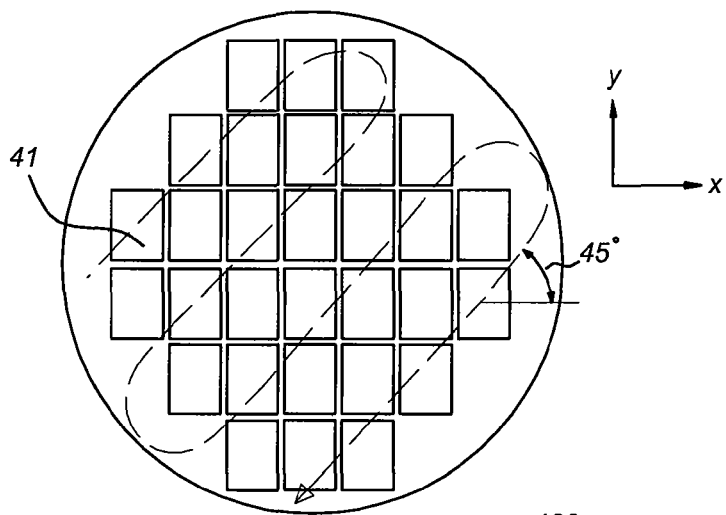

FIG. 6 schematically depicts a substrate with a plurality of target portions and arrows indicating the scanning path of the level sensor according to an embodiment of the invention.

Figure 7A:
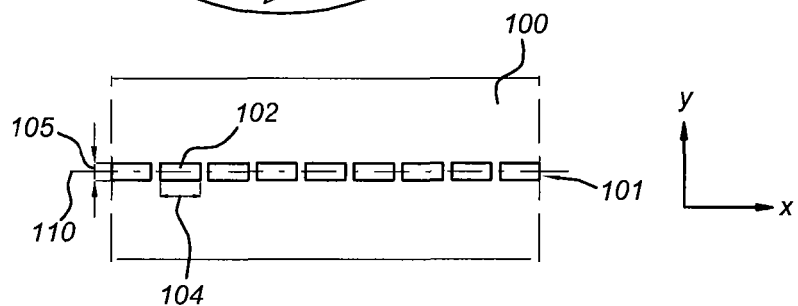
Figure 7B:
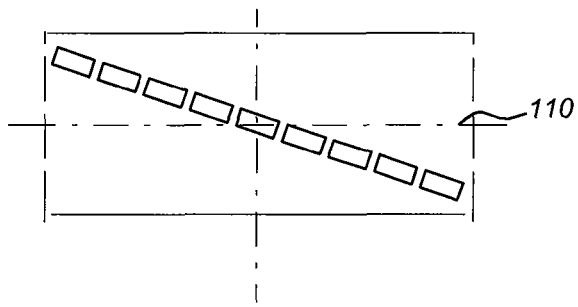
Figure 7C:
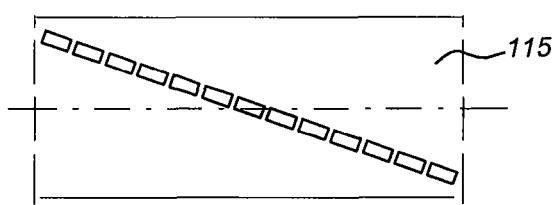

FIGS. 7a-7c show three embodiments of a level sensor grid.

FIGS. 8-13 schematically show arrangements of a level sensor according to different embodiments of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus. The apparatus includes:

- an illumination system (illuminator) IL constructed and arranged to condition a radiation beam B (e.g., UV radiation or EUV radiation).
- a support structure (e.g., a mask table) MT constructed to support a patterning device (e.g., a mask) MA and connected to a first positioner PM constructed and arranged to accurately position the patterning device in accordance with certain parameters;
- a substrate table (e.g., a wafer table) WT constructed to hold a substrate (e.g., a resist-coated wafer) W and connected to a second positioner PW constructed and arranged to accurately position the substrate in accordance with certain parameters; and
- a projection system (e.g., a refractive projection lens system) PS constructed and arranged to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks MA1, MA2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure target portion limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure target portion limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Level Sensor

The level sensor measures heights of substrates W or of areas on the substrate table WT to generate height data. A surface, of which the height is to be measured, is brought in a reference position and is illuminated with a measurement beam of radiation. The measurement beam of radiation impinges on the surface to be measured under an angle which is less than 90°. Because the angle of incidence is equal to the angle of reflection, the measurement beam of radiation is reflected back from the surface with the same angle to form a reflected beam of radiation. The measurement beam of radiation and the reflected beam of radiation define a measurement plane. The level sensor measures the position of the reflected beam of radiation in the measurement plane.

If the surface is moved in the direction of the measurement beam of radiation and another measurement is done, the reflected beam of radiation is reflected in the same direction as before. However, the position of the reflected beam of radiation has shifted the same way the surface has been moved.

The level sensor is arranged to perform a level sensor scan over the target portion providing level sensor data for the target portion.

In FIG. 3, a part of the measurement station region of lithographic apparatus according to an embodiment of the invention is shown. The substrate W is held on the substrate table WT. Two wafer stage chucks WT are visible in FIG. 3. The left hand side is the substrate table in the expose position I and the right hand side is the substrate table WT in the measure position II.

The substrate table WT is connected to actuators. An example of another embodiment of a substrate table WT is shown in FIG. 5. Actuators 23, 24 are connected to a control device 6 with a processor 8 and a memory 10 (FIG. 3). The actuators may include any type of positioning actuator, such as a piezo-electric actuator, a pneumatic actuator, a linear motor, a Lorentz actuator, a cam disk or a spindle. An aspect of a piezo-electric actuator and a cam disk is their high stiffness, thus increasing the eigenfrequencies of the substrate table and increasing the position accuracy thereof. Actuators 23, 24 move over respective guides 21, 22. The two actuators 23 will be able to bring about a tilt around a Z-axis.

Not shown in FIG. 5 is an actuator for generating a relative movement in the Z-direction. This actuator is also connected to the processor 8. This actuator is controlled to position the substrate surface of substrate W in the focal plane of the projection system in accordance with the height data or corrected height data acquired according to an embodiment of the invention.

The processor 8 further receives information from position sensors measuring the actual position of the substrate table WT or substrate table holder by electric (capacitive, inductive) or optical, e.g., interferometric devices. FIGS. 1 and 2 show examples of direction definitions X, Y, Z. Z is usually used to indicate a height direction, as shown in FIG. 1, right hand side. The substrate W is positioned in the X-Y plane as indicated in FIG. 2. Scanning of the surface according to FIG. 4 is executed by performing long strokes in the Y direction over the middle part of fields 40 on the substrate W.

FIG. 3 shows a system for determining the position of a wafer on the wafer/substrate table WT or "chuck" as it is sometime referred to in the art. This includes two interferometers IF, one on each of opposite sides of the substrate table WT. Each interferometer IF is positioned to direct measurement radiation onto one of a first pair of mirrors M1 that are provided on opposing sidewalls of the table, these mirrors M1 being substantially perpendicular to the radiation emitted from the associated interferometer IF. These will be referred to as the X-mirrors M1. In addition, each interferometer IF is positioned to direct measurement radiation onto one of a second pair of mirrors M2 that are angled at 45 degrees to the direction of propagation of radiation from the interferometer IF. These mirrors M2 are provided on opposing sidewalls of the table WT. These will be referred to as the angled mirrors M2.

The X-mirrors M1 and the angled mirrors M2 are carried on the wafer table WT and so move when the table WT is moved. Radiation reflected from each X-mirror M1 is directed back to its associated interferometer IF and can be used to determine the x-position of the wafer table WT. Radiation reflected from the angled mirrors M2 is directed onto one of a pair of Z-mirrors ZM positioned above the level of the wafer table WT and then subsequently reflected back to the interferometer IF. The dots that are shown on the Z-mirrors ZM of FIG. 2 are indicative of the positions where the interferometer IF beams reside during measurements. By using radiation reflected from each Z-mirror ZM in combination with a measure of the x-position determined using the X-mirrors M1, it is possible to obtain an indirect measure of the height of the Z-mirror ZM and so the wafer table WT.

The processor 8 also receives input from a level sensor LS which measures the height and/or tilt information from the target area C on the substrate W where the projection beam PB hits the substrate surface. In an embodiment, the control device 6 is connected to a reporting system 9, which may include a PC or a printer or any other registration or display device.

The level sensor LS may be, for example, an optical sensor as described here; alternatively, a pneumatic or capacitive sensor (for example) is conceivable. In FIG. 3 also an air gauge GA is shown in the measure position.

A level sensor is provided to determine a level parameter of the substrate W to enable a controller 6 to position the substrate surface in the focal plane of the projection system PS. The level sensor may include a level difference sensor constructed to measure a level difference between the surface of the substrate and the surface of the surrounding structure and the level parameter includes the level difference. A result of this arrangement may be that measurement of the level difference can be performed as a single action, thus obviating a need to measure the level of the substrate and the surrounding structure separately. Further, the level difference may be measured with existing level sensors used for focus control during exposure of the substrate.

In another embodiment, the level sensor includes a level measurement sensor constructed to measure a level of the surface of the substrate when held by the substrate table and the level parameter includes the level of the surface of the substrate. In this case, the controller is further provided with a level of the surrounding structure to position the substrate table with respect to the surrounding structure. An aspect of this configuration is that this provides for a simple solution, useful in an embodiment wherein only the substrate table is moved by the actuators and the surrounding structure is stationary.

The level sensor LS will generally measure the vertical position of one or more small areas (level sensor spots LSS) of e.g., 6-25 mm$^2$ (e.g., 2×4 mm) of the substrate W to generate height data. The level sensor LS shown in FIG. 3 includes a radiation source for producing a radiation beam 16, projection optics (not shown) for projecting the light beam 16 onto the substrate W, detection optics (not shown) and a sensor or detector. The level sensor includes a projection part 2 and a detection part 15.

In particular cases the LSS have a size defined by the length and width of the spot on the surface of the substrate. The length can be defined as the length of the spot in the scanning direction, according to prior art arrangements in the Y-direction. The level sensor spots according to the embodiment of FIG. 2 are obtained in an embodiment using a level sensor grid 100 as shown in FIG. 7a. The grid 100 is provided with a grating 101. Each gap 102 has dimensions width 104× height 105. The width 104 of slit 102 corresponds generally with the width of the LSS on the substrate if the grid is positioned in parallel with the substrate surface as would be the case in prior art arrangements. In an exemplary case the height 105 of the slit 102 in the scanning direction is about 4 times smaller than the width. This allows a balance between desired resolution of scanning and being able to ignore or take into account measurement results of spots near edges of the substrate (which results are invalid).

The detection part 15 generates a height-dependent signal, which is fed to the processor 8. The processor 8 is arranged to process the height information and to construct a measured height map. Such a height map may be stored by the processor 8 in the memory 10 and may be used during exposure.

According to an alternative, the level sensor LS (2, 15) may be an optical sensor making use of Moiré patterns formed between the image of a projection grating reflected by the substrate surface and a fixed detection grating, as described in U.S. Pat. No. 5,191,200, incorporated herein by reference in its entirety. In an embodiment, the level sensor 15 measures the vertical height of a plurality of positions simultaneously and/or measures the average height of a small area for each position.

The level sensor spots LSS, M2-M6 according to FIG. 2 are arranged in a first direction, in FIG. 2 in the X-direction. Subsequent measurement of M2 result in the array of measurements according to FIG. 2. The measurements are repeated. Dependent on the interval time between the measurements and the relative speed of the substrate W with respect to the level sensor, these measurement points are separated by a pitch. The pitch can be adjusted by changing one of the variables. It is relatively straightforward to shorten the time interval and repeat the measurements at a higher rate.

The embodiments described here may of course also be used for other types of level sensors, such as air gauges. An air gauge, as will be known to a person skilled in the art, determines the height of a substrate W by supplying a gas flow from a gas outlet to the surface of the substrate W. Where the surface of the substrate W is high, i.e., the surface of the substrate W is relatively close to the gas outlet, the gas flow will experience a relatively high resistance. By measuring the resistance of the flow as a function of the spatial position of the air gauge above the substrate W, a height map of the substrate W can be obtained. A further discussion of air gauges may be found in EP0380967, incorporated herein by reference in its entirety.

According to another embodiment, a scanning needle profiler is used to determine a height map of the substrate W. Such a scanning needle profiler scans the height map of the substrate W with a needle, which also provides height information.

In fact, all types of sensors may be used that are arranged to perform height measurements of a substrate W, to generate height data.

The level sensing method uses at least one sensing area and measures the average height of a small area, referred to as a level sensor spot LSS, such as the five spots M2-M6 according to FIG. 2.

According to an embodiment, the level sensor may simultaneously apply a number of measurement beams of radiation, creating a number of level sensor spots LSS on the surface of the substrate W. As shown in FIG. 1, the level sensor may for instance create five level sensor spots LSS in a row. The level sensor spots LSS scan the area of the substrate W to be measured (for instance target portion C), by moving the substrate W and the level sensor relatively with respect to each other, indicated with arrow A (scanning direction).

Depending on the position of the level sensor spot LSS on the substrate W, a selection mechanism selects the level sensor spot or spots LSS, which are applicable to derive height data from a measured target area C. Based on the selected level sensors spots LSS, a level profile may be computed.

The depicted apparatus can be used in various modes. For example, in step mode, the mask table MT and the substrate table WT are kept essentially stationary, while an entire pattern imparted to the projection beam is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

In order to determine an absolute mirror map, the x-position of the wafer table WT is monitored using the interferometers IF and a plurality of level sensor LS measurements is performed at various different x-positions across the wafer. Each level sensor measurement may optionally be static. In this case, typically each level sensor takes a number of measurements at each measurement point and provides an average value, thereby to reduce the effects of noise. In a typical example, each level sensor may take six hundred readings at a single point, although different sensors may be constructed and arranged to take different numbers of readings and indeed different numbers of readings may be taken at different positions of the substrate table. As will be appreciated, whilst increasing the number of measurements reduces the effects of noise, it also increases the measurement time. Hence, there is a trade off between calibration time and measurement accuracy. As an alternative to a static measurement, the wafer table WT may be moved along the direction of the level sensor array LS, whilst the level sensor array LS is taking measurements. Measurements relating to specific points of the wafer may be obtained by sampling the sensor outputs at appropriate times. In this case, the number of measurements that are taken at each point will typically be lower than for the static measurement, and may be only one.

In the example shown in FIG. 5, the wafer table WT is movable using a controller 6. In particular, the wafer table WT is moved parallel to the X-axis using actuators 23 in steps from the extreme left position to the extreme right position. After each step, all level sensors covering a target wafer point take a measurement.

Actuators 23, 24 are arranged to generate a relative movement of the substrate table WT with respect to level sensor fixed to the lithographic apparatus. The actuator will have a maximum speed. Scanning according to FIG. 4 will have a maximum scanning speed in the Y direction limited by this maximum speed.

The controller 6, which is connected to the actuators 23, 24, is constructed and arranged to control operation of the actuators. The controller 6 is also provided with an output signal from a level sensor.

The controller 6 can include any type of controller such as an electronic controller, analog, digital, or a combination thereof, including, e.g., a microprocessor, microcontroller, other type of programming device, application specific integrated circuitry, or any other type of programmable device. The actuator can be connected to the controller via any suitable connection, such as an analogue line, a digital line, a multiplexed digital line, or any other communication channel.

According to an embodiment of the invention, during scanning of the substrate W with the level sensor, the substrate table WT is moved relative to the level sensor in a combined movement generated by a combination of actuating in the X and Y directions. This allows a scanning speed higher than the maximum speed of one of the actuators, in particular a higher speed than scanning in only the Y—direction according to FIG. 4.

An embodiment of scanning with the level sensor is shown in FIG. 6. According to this embodiment, the level sensor scans the substrate surface using long strokes. The strokes may be elongated in one direction. In another embodiment, the strokes may be wavy or periodic. In an embodiment, a Y direction movement is modulated with a movement in the X direction under the influence of the X-actuators 23.

A combined movement of the actuators 23, 24 results in strokes at an angle of generally 45 degrees with each axis. Since the movement of the actuators 23, 24 is combined, a resulting combined speed is roughly 41% higher. The result is that according to this embodiment scanning of the total surface of the substrate can be performed quicker, resulting in time savings, in particular at the measure position.

Any of the level sensors known to the skilled person can be used in combination with the invention in order to achieve the time saving due to the higher scanning speed.

In an embodiment the substrate table WT is rotated over an angle corresponding to the angle of combined movement of the actuators. This allows the heart line of the target portions 40, 41 of FIGS. 3 and 6 to be aligned with the scanning direction according to an embodiment of the invention. In this approach, the substrate table is rotated over 45 degrees for scanning. After scanning, the substrate table can be rotated back the same angle. This allows the projection of radiation according to prior art arrangements.

The level sensor spots according to the embodiment of FIG. 2 are obtained in an embodiment using a level sensor grid 100 as shown in FIG. 7a. FIG. 7a shows axis X,Y to indicate a grid coordinate system. The grating 101 is positioned parallel to the X direction over the middle part of the grid 100. Hereinafter gX, gY and gZ will refer to these defined grid axis. Further rotation around any of these axes will be referred to hereinafter as gRx, gRy and gRz. gRz refers to rotation of the grid in the plane as shown in FIG. 7a.

In the embodiment shown in FIG. 4, the level sensor directs its radiation beam onto the substrate surface at an angle ALPHA, here defined as the direct angle between substrate surface and incident beam. This angle may be 5-80 degrees, for example 5-40, such as 20 degrees. This angle ALPHA will be used hereunder as the incident angle of the level sensor radiation.

In between the radiation source (not shown) of the level sensor and the radiation beam 16 directed at the substrate W, grid 100 is positioned. The grid 100 is part of the detection part 2 of the level sensor. The grating 101 results in the formation of the level sensor spots according to FIG. 2. The grid 100 is positioned perpendicular to the traveling direction of the beam 16.

The size of the level sensor spots LSS depends on the size of the slits 102 and the angle of incidence ALPHA. In an embodiment the grid 100 can be positioned such that the LSS have approximately the same width 104 and a height/length of about height 105/sin(ALPHA). If ALPHA is about 20 degree, the size of the spot will be about 3× height 105 of the gap 102 due to the enlargement of the angle of incidence.

In a first embodiment, the arrangement of the grid 100 is maintained and corresponds to prior art arrangements. The level sensor spots LSS according to this arrangement will be aligned with the X axis of the substrate surface and will move according to the embodiment under an angle of 45 degrees with respect to the XY plane of the substrate during the scanning with the level sensor.

In another embodiment of the level sensor, the level sensor is adapted in order to project the level sensor spots LSS at an angle corresponding with the angle of combined movement generated by the actuators. If the combined movement is oriented as shown in FIG. 6, the LSS can be tilted over 45 degrees in the XY plane of the substrate. This can be obtained by tilting the grid 100 over an angle of GAMMA, wherein GAMMA is generally equal to 45/sin(ALPHA). The tilt GAMMA is an embodiment around the z-axis (gRz) of the grid, being the rotation axis out of the plane according to FIG. 7a.

Figure 8:
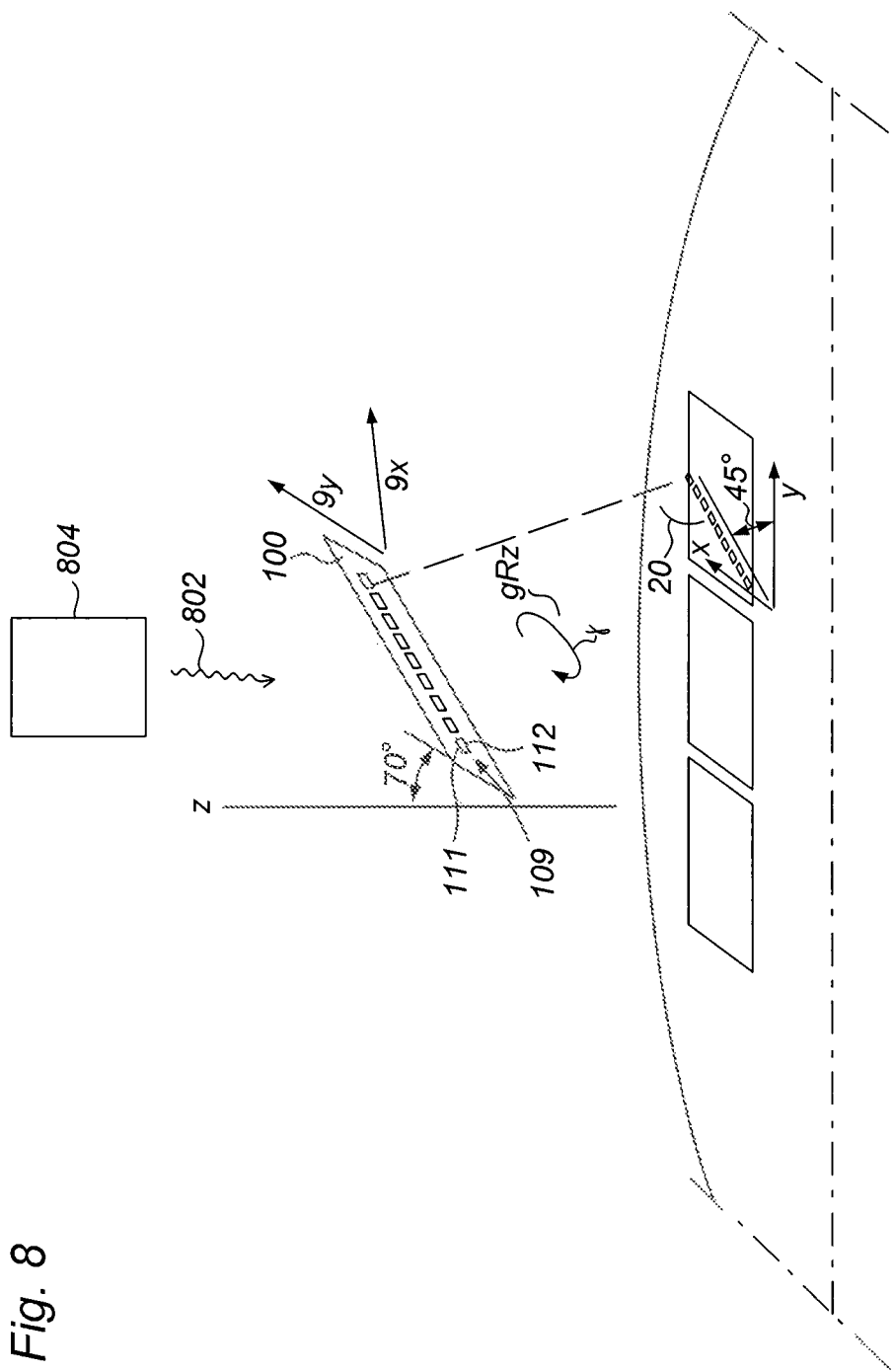

FIG. 8 shows schematically this embodiment. The skilled person will understand the representation according to FIGS. 8-14, wherein the projection optics being part of projection part of the level sensor is not depicted for clarity sakes. Grid 100 is part of the projection part of the level sensor and is positioned in the path of a radiation beam 802 emitted by a radiation source 804 of the projection part. Further optical elements such as mirrors, lenses etc. may be part of the projection part.

By rotating the grid 100 over GAMMA degree around gRz, the level sensor spots are rotated as depicted in FIG. 8.

Grid 100 was originally positioned at an angle of 70 degrees with respect to the Z-axis. In this way the beam 16 is very close to perpendicular to the lane of gaps 102. However such a position results in the fact that only the central part 110 of the gaps 102 can be in focus on the substrate surface in the embodiment according to FIG. 8. The optical distance from the top side 111 of the gap 109 to the substrate surface is longer than the distance from the down side 112 of gap 109 to the substrate surface. In an embodiment the grid is positioned such that this effect does not occur. Such positioning to counter the defocus is referred to as the Scheimpflug condition. Instead of a 70 degree tilt with respect to Z, the grid may be tilted 90 degrees. The grid 100 is then positioned generally parallel to the substrate surface W. This allows the complete set of LSS to be in focus.

Figure 9:
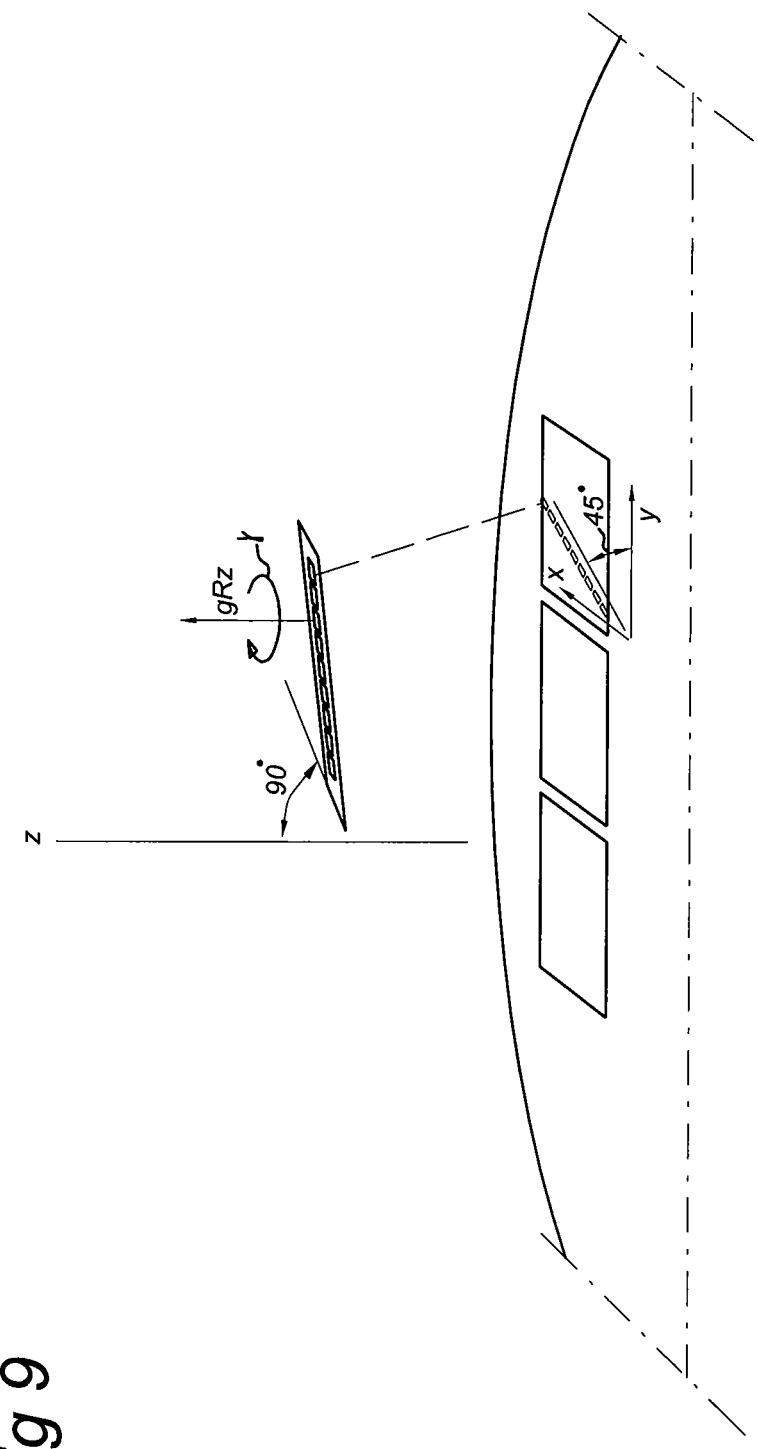

FIG. 9 shows an embodiment for obtaining focused LSS at an angle of 45 degrees with respect to the XY plane of the substrate W. The grid is positioned such that the LSS obey the Scheimpflug condition, wherein the complete level sensors spots are now focused. The grid 100 is tilted over DELTA degrees, about 45 in an embodiment, around gRz in order to rotate the spots correspondingly.

Figure 10:
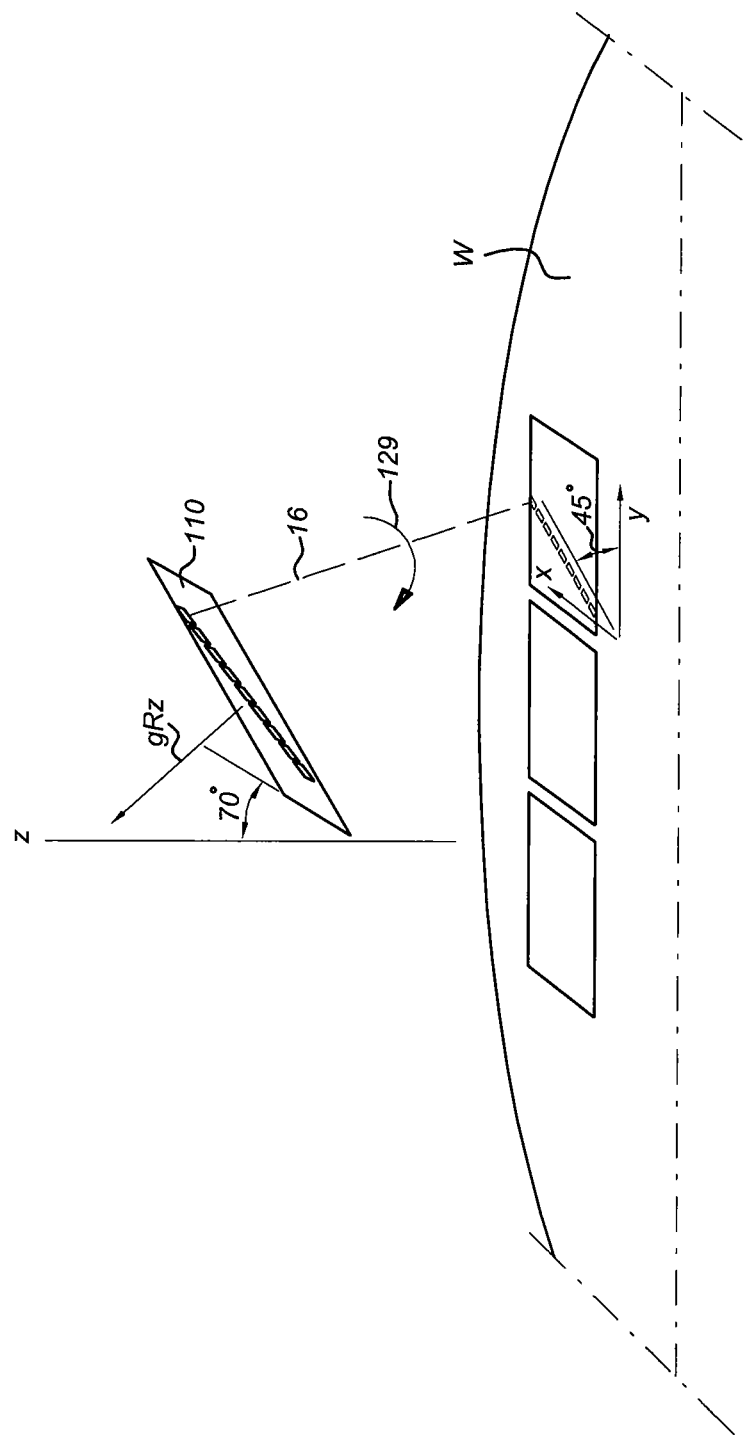

According to another embodiment, FIG. 10 includes, instead of grid 100, grid 110 according to FIG. 7b positioned in the path of radiation 16. Grid 110 differs from grid 100 in that the grating is positioned diagonally over the rectangular body of the grid 110. The result is that the tilt 129 around gRz is changed in respect to the situation according to the first and second embodiments (FIGS. 8, 9). The tilt 129 will be less than angle GAMMA.

Figure 11:
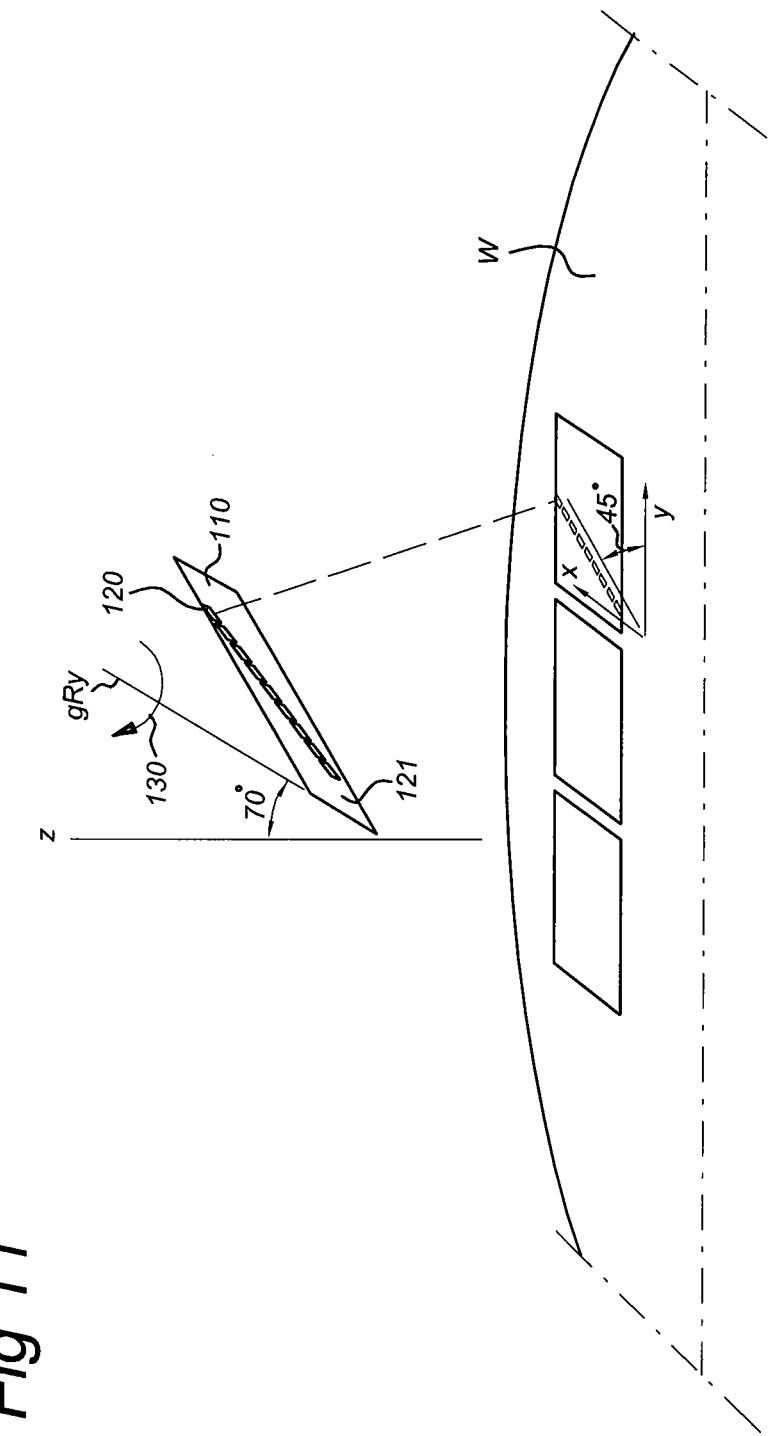

According to another embodiment, FIG. 11, the grid 110 is not tilted around gRz. Such a tilt may, however, require a redesign of current level sensors. According to the embodiment as shown in FIG. 10 the grid is rotated with respect to its position in previous systems. Space for such a rotation is not available in some previous lithographic systems.

FIG. 11 shows the grid 110 positioned such that the LSS are rotated over 45 degrees with respect to the XY plane of the substrate surface, wherein the grid 100 is tilted around gRy over an angle 130. In fact part 120 of grid 110 is more forward (downstream) than part 121 which is more upstream. As the LS spots formed as a result of the gaps near 120 are also positioned more forward in the Y direction of the substrate surface, the tilting around gRy will result in reducing the defocus of the spots in comparison with the embodiment according to FIG. 10.

Figure 12:
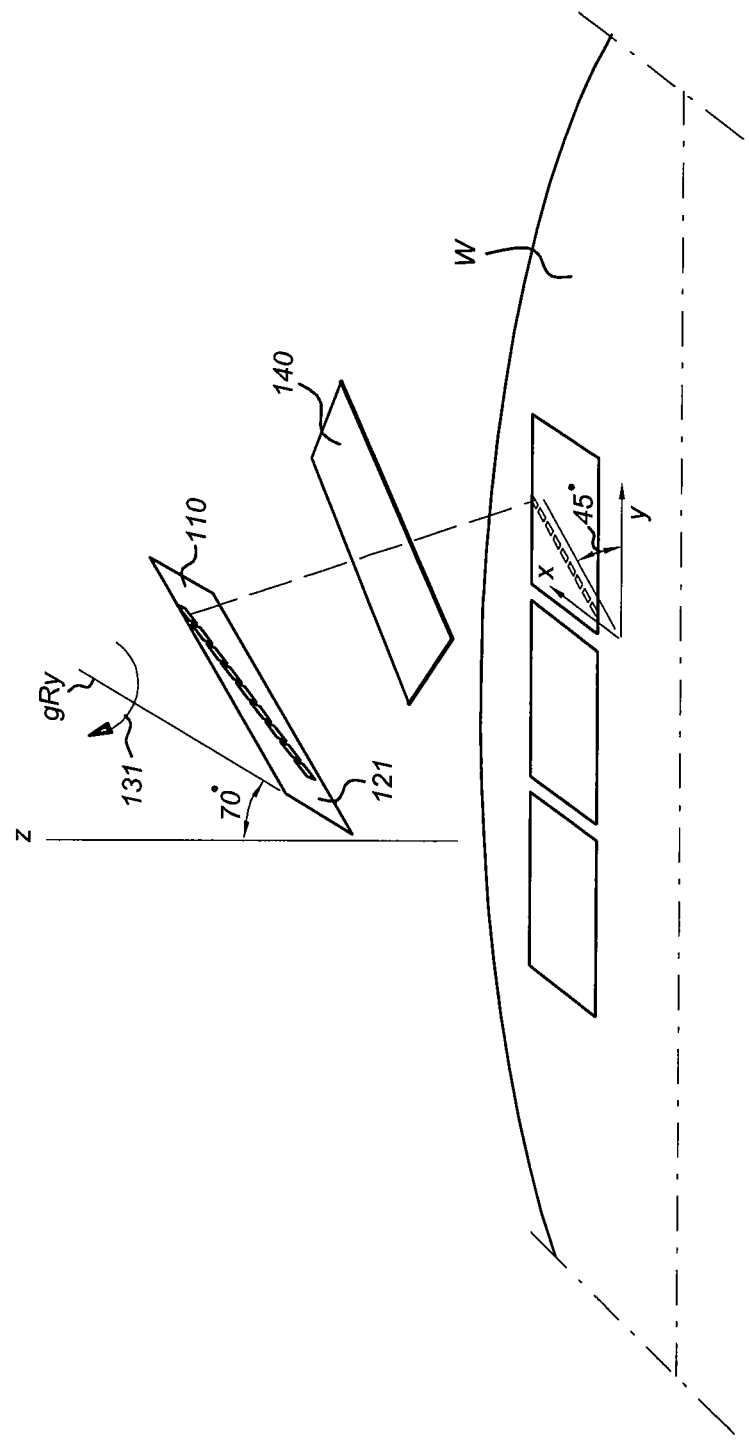

FIG. 12 shows a further embodiment having basically the same arrangement for the grid 110. The projection part of the level sensor as schematically illustrated in FIG. 12 now includes an optical element 140 in the pathway of the radiation beam 16. The radiation beam will penetrate the optical element 140 and will be influenced in accordance with refractive index of the material of the optical element.

In an embodiment, the optical element includes wedges. Since the grid 110 is tilted around gRy with an angle 131, optical element 140 including wedges, for example wedges adapted for each spot, can compensate phase differences between the spots. This allows the use of a detection grating according. The skilled artisan will understand how to adapt the wedge thickness to compensate the focus difference.

Rotation of the grid 100 or grid 110 according to any of the embodiments shown in FIGS. 8-12 in order to rotate the LSS on the substrate surface results in a wider LSS array. In FIG. 2 the width of five LSS is indicated with WLSS. If the grid 100 or 110 is rotated according to any of the mentioned embodiments in order to orient the LSS array under, for example, an angle of 45 degrees with respect to the XY plane of the substrate surface, this width WLSS will become approximately 1.41 times wider.

In an example, the result of the combined movement of both actuators at full speed resulting in about 45 degree directed strokes during scanning as illustrated in FIG. 4 and the approximately 1.41 wider LS array, is a possible time saving of 50%. Since the speed is increased and the width of the LS array is also increased, a level sensor arranged and adapted according to embodiments of the invention may perform its level sensing method at double speed.

When rotating the LS spots on the grating, the originally used width of the LSS may be maintained in order to have an extra gain of LS width. In another embodiment, grid 115 according to FIG. 7c may be used. Grid 115 has a diagonal grating having more slits 102, e.g., 13 instead of 9. Using the amended grid 115 in the embodiments according to FIGS. 8-12 would result in having a LSS array having generally the same size of spots on the substrate surface. According to this embodiment, the same density of measurements point for height measurements can be maintained.

Figure 13:
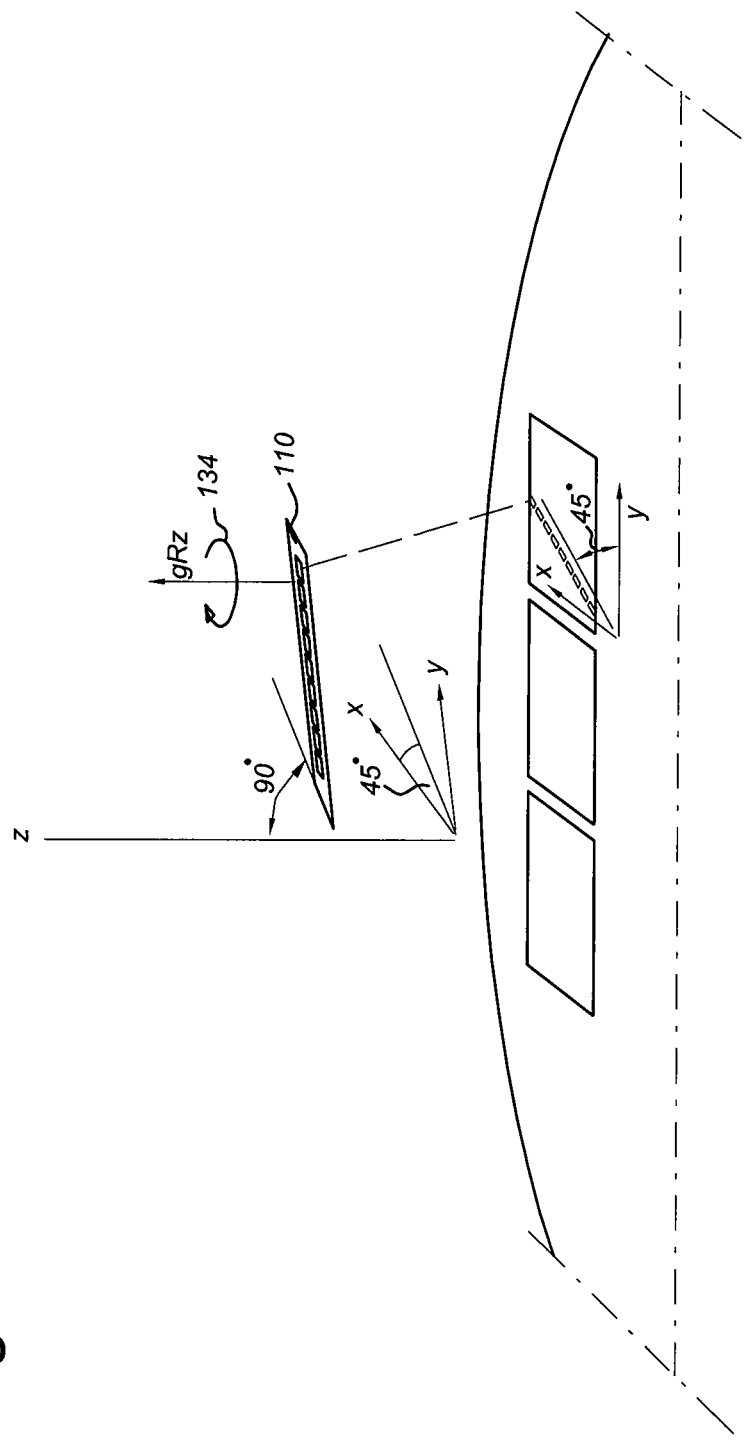

FIG. 13 shows a further embodiment having a Scheimpflug-positioned grid 110 rotated around gRz over an angle 134, of about 45 degrees, in order to rotate the LSS over 45 degrees. The Scheimpflug condition is obtained by a rotation of the grid around gRx.

FIGS. 8-13 only show essential elements of the projection part of a level sensor. The skilled person will understand that corresponding measures can be taken at the detection part of the level sensor. Also, the detection part includes a grid. This can be, for example, a grid 100, grid 110 or grid 115. The detection part grids can be rotated around a gRz, gRy, gRx in order to allow detection of the rotated LSS and to be able to measure the Scheimpflug-conditioned LSS. The skilled person will understand from the foregoing that it is possible to combine different embodiments for the projection part and the detection part. However it may improve the simplicity of the design to have the projection part and detection part arranged in a similar fashion.

In an embodiment the substrate table is rotated around Rz in order to align the fields 40 with the improved scanning stroke according to embodiments of the invention. The substrate table WT is rotated over 45 degrees in order to allow maximum scanning speed. Now LS scanning is performed at higher speed, but with the strokes aligned with the fields 40 on the substrate.

Since according to at least one aspect of the invention it is proposed to scan the heights of the substrate surface in a direction at an angle with respect to the middle of the fields as illustrated in FIG. 4, it is proposed according to embodiments of the invention to correct the measured heights according to any of the methods of the invention. The correction can be a single calibration. The calibration is performed with respect to layout-dependent measurement, wherein scanning strokes are performed according to FIG. 4.

In an embodiment, the layout independent leveling calibration utilizes a calibration mechanism (such as a fingerprint mechanism) for a robust mechanism to calibrate the effect of layout independent measurement in relatively short time. Using the mechanism described here, it is possible to calibrate using a single substrate or target portion, although calibration may also be done using more then one substrate or target portion.

In an embodiment, the calibration identifies a set of at least one special calibration target portion. Each calibration target portion is scanned multiple times. Each target portion is scanned with the level sensor at least once in every possible pattern of level sensor measurement that is performed on any target portion on the substrate.

So, during calibration, the at least one calibration target portion is measured a number of times where each time the level sensor has a different relative position with respect to the target portion. The relative positions of the scans are chosen such that they correspond to a possible level sensor scan as will be performed during actual level sensor measurements as will take place for actual exposure.

By comparing the different calibration scans performed with the different relative positions with respect to the target portion, the actual level sensor scans and data as gathered later on for actual exposure can be compensated to minimize differences between the exposure focus between target portions on a substrate.

By comparing the different calibration scans, the effect of the relative position of the level sensor scan on the exposure focus data can be predicted and thus compensated.

For the most common columnar layout, the number of calibration scans may be the number of strokes in the layout independent leveling data acquisition. This calibration can be viewed as superimposing all the different patterns of scanning a target portion 41 according to the method of FIG. 6 on the target portion 40.

According to an example, two patterns measured according to any method using two actuators according to the invention can be superimposed on a pattern measured according to FIG. 4 of a corresponding target portion 40, 41. Each pattern of the three patterns of measurement on this target portion generates a set of focus exposure set points. The difference between the focus exposure set points of a layout independent pattern and the layout dependent pattern is the calibration (data) of that layout dependent pattern.

A calibration mechanism is used to generate a robust set of measurements to use as input for the calibration. The standard deviation of all the readings in each calibration target portion is calculated. According to an embodiment, the target portions with the highest standard deviation value are discarded from the calibration. The (remaining) target portions may be averaged point by point to create the calibration data (fingerprint data).

During the actual level sensor measurements as performed on a target portion before exposure, the calibration data (fingerprint) can be used to correct the actual exposure focus. By doing so, the difference between exposure focus of different target portions, as far as these result from the fact that the level sensor measurements were performed with a different relative position to the center of the target portion, is reduced.

It will be understood that the calibration data (fingerprint) may include corrections for the exposure focus as computed based on the level sensor data. However, according to an alternative, the calibration data (fingerprint) may also include corrections for the level sensor data, so exposure focus can be computed based on the corrected level sensor data.

According to an aspect of the invention multiple wafers are manufactured with the lithographic apparatus according to the invention. The wafers are manufactured layer after layer. For all layers of a certain series of wafers having the same structure, a calibration measurement according to the invention is performed. For each layer of a certain series of wafers, a calibration measurement is performed by scanning the heights of the substrate surface after production of said layer, and said data is compared to the data obtained with a method according to an embodiment the invention, for example scanning at 45 degrees with respect to the middle of the target areas of the substrate. By comparing the two measurement data, a correction map or calibration data can be obtained for correction the heights measured with the method or apparatus having a higher scanning speed according to the invention.

The data set of heights corresponding to a wafer having said layer produced last, is corrected according to embodiments the invention with the calibration data obtained according to the correction method of embodiments of this invention.

The calibration data may have the form of a calibration table, in which for a number of relative x,y positions within a target portion a calibration value is stored that may be used to compute corrected level sensor data. Different calibration tables may be provided for different relative positions of the level sensor scan.

It will be understood that the calibration correction can be applied in many ways. The calibration correction can be used to directly correct the measured level sensor data, and compute exposure focus data based on the corrected level sensor data. Alternatively, the level sensor data can be used to compute exposure focus data, where the calibration data can be used to correct these exposure focus data to obtain corrected exposure focus data.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

In the present document, the terms "radiation" and "beam" are used to encompass all types of electromagnetic radiation or particle flux, including, but not limited to, ultraviolet radiation (e.g., having a wavelength of or about 365 nm, 355 nm, 248 nm, 193 nm, 157 nm or 126 nm), extreme ultraviolet radiation (EUV), X-rays, electrons and ions. Also herein, the invention is described using a reference system of orthogonal X, Y and Z directions and rotation about an axis parallel to the I direction is denoted Ri. Further, unless the context otherwise requires, the term "vertical" (Z) used herein is intended to refer to the direction normal to the substrate or mask surface, rather than implying any particular orientation of the apparatus. Similarly, the term "horizontal" refers to a direction parallel to the substrate or mask surface, and thus normal to the "vertical" direction.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic projection apparatus comprising:
   a support constructed to support a patterning device, the patterning device being capable of imparting a radiation beam with a pattern in its cross-section to form a patterned radiation beam;
   a substrate table constructed and arranged to hold a substrate;
   a projection system constructed and arranged to project the patterned radiation beam onto a target portion of the substrate;
   a level sensor constructed and arranged to perform height measurements of at least part of the substrate to generate height data, for use in positioning a target portion of the substrate with respect to a focal plane of the projection system, wherein the level sensor comprises:
      a projection part configured to direct radiation onto the substrate, the projection part comprising a radiation source and a projection grid having slits positioned downstream from the radiation source, and
      a detection part configured to detect reflected radiation from the substrate surface, the detection part comprising a detector and a detection grid having slits positioned in between the substrate and the detector;
   a first actuator constructed and arranged to move the substrate table at least in a first direction perpendicular to an edge of the substrate having a maximum speed;
   a second actuator constructed and arranged to move the substrate table at least in a second direction perpendicular to a surface of the substrate having a maximum speed; and
   a controller constructed and arranged to generate a stroke of relative movement between the substrate and the level sensor, by controlling the first and second actuator,
   wherein the controller is constructed and arranged to combine first and second actuator movement to effect combined movement at a speed higher than the maximum speed of one actuator, and
   wherein the level sensor is configured to project and detect level sensor spots that are rotated to align with the stroke of relative movement between the substrate and the level sensor so as to change a width of the level sensor spots to be greater than a width that the level sensor spots would be if the level sensor spots are not aligned with the stroke of relative movement, and
   wherein the combined movement of the actuators and the increase in the width of the level sensor spots decrease a time to perform the height measurements.

2. The lithographic projection apparatus according to claim 1, wherein the controller is constructed and arranged to generate the stroke of combined movement by combining at least 71% of the maximum speed of both actuators.

3. The lithographic projection apparatus according to claim 2, wherein the controller is constructed and arranged to generate the stroke of combined movement of both actuators by moving the substrate table at substantially a maximum speed thereof.

4. The lithographic projection apparatus according to claim 1, wherein said substrate table is moveable to effect a scanning exposure of a substrate carried by said substrate holder, and said level sensor is arranged to measure at least one of the vertical position and the tilt about at least one horizontal axis of a target area on said substrate.

5. The lithographic projection apparatus according to claim 1, wherein the level sensor spots on the substrate are rotated over substantially 45 degrees with respect to the direction of movement of at least one of the actuators.

6. The lithographic projection apparatus according to claim 5, wherein at least one of the projection grid or the detection grid is tilted such that the slits are at different distances from the radiation source.

7. The lithographic projection apparatus according to claim 5, wherein at least one of the projection grid or the detection grid is tilted around an axis substantially perpendicular to a plane formed by a traveling direction of the radiation and an axis of the slits.

8. The lithographic projection apparatus according to claim 5, wherein the projection grid is tilted such that a tilt angle of the projection grid and an incident angle of the radiation combine to substantially 90 degrees.

9. The lithographic projection apparatus according to claim 5, wherein the projection grid is tilted such that a tilt angle of the projection grid and an incident angle of the radiation meet the Scheimpflug condition.

10. The lithographic projection apparatus according to claim 5, wherein the projection part further comprises a wedge positioned in the path of radiation downstream from the projection grid for adapting the optical path length of the radiation.

11. The lithographic projection apparatus according to claim 5, wherein the detection part further comprises a wedge positioned in the path of radiation upstream from the projection grid for adapting the optical path length of the radiation.

12. The lithographic projection apparatus according to claim 1, wherein at least one of the projection grid or the detection grid is generally of rectangular shape, having a row of slits positioned at a non-zero angle with respect to its width.

13. The lithographic projection apparatus according to claim 1, wherein the slits are positioned substantially along the diagonal of the detection grid.

14. A method for sensing the level of a substrate carried on a substrate table, in a lithographic projection apparatus, that has a support constructed to support a patterning device, the patterning device being capable of imparting a radiation beam with a pattern in its cross-section to form a patterned radiation beam, a substrate table constructed and arranged to hold a substrate, a projection system constructed and arranged to project the patterned radiation beam onto a target portion of the substrate, a level sensor constructed and arranged to perform height measurements of at least part of the substrate to generate height data, and first and second actuators, the actuators having a maximum speed, the method comprising:

generating a stroke of relative movement between the substrate and the level sensor with the first and second actuators;

projecting radiation onto the substrate with a projection part, whereby the projection part comprises a radiation source and a projection grid having slits positioned downstream from the radiation source;

detecting reflected radiation from the substrate surface with a detection part, whereby the detection part comprises a detector and a detection grid having slits positioned in between the substrate and the detector;

rotating the grids to project and detect level sensor spots that are aligned with the stroke of relative movement between the substrate and the level sensor so as to change a width of the level sensor spots to be greater than a width that the level sensor spots would be if the level sensor spots are not aligned with the stroke of relative movement;

sensing a level of the substrate; and combining the movement generated by the two actuators to produce a combined movement at a velocity higher than the maximum velocity of movement generated by one actuator alone, wherein the combined movement of the actuators and the increase in the width of the level sensor spots decrease a time to perform the height measurements.

15. The method according to claim 14, wherein the height measurements are performed by scanning the at least part of the substrate in a scanning direction with the level sensor.

16. The method according to claim 14, wherein the first actuator generates a movement in a X-direction and the second actuator generates movement in a Y-direction, and wherein the combined movement is in the X-Y plane at an angle of at least 20 degrees with respect to the axis-directions.

17. The method according to claim 16, wherein the stroke of relative movement is substantially at a 45 degree angle with respect to the X and Y direction.

18. The method according to claim 14, wherein the method further comprises adapting the optical path length of at least one of the projected radiation or reflected radiation using refraction.

19. A non-transient computer readable medium having code or instructions stored thereon for sensing the level of a substrate carried on a substrate table, said code or instructions, when executed, causing a processor to perform the method of:

generating a stroke of relative movement between the substrate and a level sensor;

projecting radiation onto the substrate with a projection part, whereby the projection part comprises a radiation source and a projection grid having slits positioned downstream from the radiation source;

detecting reflected radiation from the substrate surface with a detection part, whereby the detection part comprises a detector and a detection grid having slits positioned in between the substrate and the detector;

rotating the grids to project and detect level sensor spots that are aligned with the stroke of relative movement between the substrate and the level sensor so as to change a width of the level sensor spots to be greater than a width that the level sensor spots would be if the level sensor spots are not aligned parallel with the stroke of relative movement;

sensing the level of the substrate with the level sensor; and combining a movement of at least two actuators for generating a combined movement of the substrate table at a velocity higher than a maximum velocity of movement generated by one actuator alone.

* * * * *

UNITED STATES PATENT AND TRADEMARK OFFICE
CERTIFICATE OF CORRECTION

PATENT NO. : 8,582,082 B2
APPLICATION NO. : 12/399737
DATED : November 12, 2013
INVENTOR(S) : Frank Staals et al.

It is certified that error appears in the above-identified patent and that said Letters Patent is hereby corrected as shown below:

In the Claims

Column 24, claim 19, line 57, after "aligned" delete "parallel".

Signed and Sealed this
Eighteenth Day of February, 2014

Michelle K. Lee
*Deputy Director of the United States Patent and Trademark Office*